United States Patent
Wei et al.

(10) Patent No.: US 7,203,918 B2
(45) Date of Patent: *Apr. 10, 2007

(54) DELAY AND SIGNAL INTEGRITY CHECK AND CHARACTERIZATION

(75) Inventors: You-Pang Wei, Los Altos, CA (US); George (Yuhung) Liao, Sunnyvale, CA (US); Mickie (Mingchi) Liu, Santa Clara, CA (US); Yu-Jiao Ping, Santa Clara, CA (US)

(73) Assignee: Legend Design Technology, Inc., Santa Clara, CA (US)

( * ) Notice: Subject to any disclaimer, the term of this patent is extended or adjusted under 35 U.S.C. 154(b) by 287 days.

This patent is subject to a terminal disclaimer.

(21) Appl. No.: 10/981,803

(22) Filed: Nov. 4, 2004

(65) Prior Publication Data

US 2005/0120317 A1  Jun. 2, 2005

Related U.S. Application Data

(60) Provisional application No. 60/531,977, filed on Dec. 24, 2003, provisional application No. 60/517,079, filed on Nov. 5, 2003.

(51) Int. Cl.
*G06F 17/50* (2006.01)

(52) U.S. Cl. .......................................... 716/5; 703/16

(58) Field of Classification Search ............ 716/5, 716/6; 703/15, 16
See application file for complete search history.

(56) References Cited

U.S. PATENT DOCUMENTS

| | | | | |
|---|---|---|---|---|
| 5,784,291 A | * | 7/1998 | Chen et al. | 716/10 |
| 5,969,631 A | * | 10/1999 | Ammler et al. | 340/825.21 |
| 6,249,901 B1 | * | 6/2001 | Yuan et al. | 716/5 |
| 6,536,012 B1 | * | 3/2003 | Mizuno | 716/1 |
| 2001/0051862 A1 | * | 12/2001 | Ishibashi et al. | 703/14 |
| 2004/0236560 A1 | * | 11/2004 | Chen | 703/18 |
| 2005/0049844 A1 | * | 3/2005 | Wei et al. | 703/14 |
| 2005/0050498 A1 | * | 3/2005 | Wei et al. | 716/6 |

* cited by examiner

*Primary Examiner*—Phallaka Kik
(74) *Attorney, Agent, or Firm*—Buchanan, Ingersoll & Rooney LLP

(57) ABSTRACT

A method for performing a signal integrity and delay check for circuit simulations is disclosed. Nodes of the circuit are selected and an optimization parameter is determined. The optimization parameter may be either the setup or hold time for the circuit simulation. The current optimization parameter is determined to be the average of the current minimum and maximum optimization parameters. A primary criteria is calculated in response to the optimization parameters. The primary criteria may be a bisection error of the circuit simulation. If the primary criteria converges to a prescribed range, then the measurement results from the simulation are parsed. If the primary criteria does not converge, then the circuit is simulated using the current optimization parameter. For a signal integrity check, switch difference errors are identified and used to set a new optimization parameter. For a delay check, delay difference errors are identified and used to set a new optimization parameter. The method of this signal integrity and delay check can be applied to semiconductor IPs (Intellectual Property) including cell, I/O and memory circuit characterization and verification.

22 Claims, 10 Drawing Sheets

DELAY AND SIGNAL INTEGRITY CHECK AND CHARACTERIZATION

RELATED APPLICATIONS

The present application claims the benefit of U.S. Provisional Application No. 60/517,079 entitled "SIGNAL-INTEGRITY CHECK AND CHARACTERIZATION" filed Nov. 5, 2003, and U.S. Provisional Application No. 60/531,977 entitled "DELAY CHECK AND CHARACTERIZATION" filed Dec. 24, 2003, the contents of both are incorporated herein by reference.

FIELD OF THE INVENTION

The present invention generally relates to computer aided methods and tools for designing, simulating, characterizing and verifying integrated circuit (IC) designs, and more particularly to a system and method for checking and characterizing delay and signal integrity.

BACKGROUND OF THE INVENTION

The design of very large-scale integrated (VLSI) circuits using computer aided design (CAD) systems is a very time consuming and computationally intensive process. As the complexity of VLSI circuit designs has increased, circuit designers have begun incorporating basic circuit building blocks into circuit designs so that the designers do not need to start from scratch for each design. This design approach is commonly referred to as an intellectual property (IP) based design approach and the basic circuit building blocks are referred to as IP blocks.

In accordance with system on chip (SoC) technology, a variety of circuit building blocks are incorporated onto a single integrated chip. Each of the building blocks performs a specific function of an electronic system. The IP building blocks include, but are not limited to, embedded memory, standard cell, I/O devices, analog and system interfaces, etc.

A timing model including many characterized timing parameters for each IP block that is to be incorporated into a system chip is required by the IC designers. Important timing parameters include setup time, hold time, access time, minimum pulse high and low time and other I/O pin characteristics. Designers are interested in characterizing and optimizing timing characteristics associated with an IP block design.

There are two methods of IP block characterization and verification. The first method is based on 'full circuit' simulations. For deep submicron designs, the size of the layout extracted IP blocks could be enormous with a large number of resistors and capacitors. It can be prohibitive to run numerous full circuit simulations with a high-accuracy circuit simulator. The other method of characterization and verification is based on 'critical-path circuit' simulations. Instead of using a full circuit, a small detailed critical circuit including multiple critical paths is used for simulation. The 'critical path circuits' are built either manually or by software tools for automation, accuracy and performance.

The simulation results observed during the characterization process are only at the pins of the full circuit or at the ports of the 'critical path circuit'. Reliability issues such as noise margin, glitch, racing conditions, and signal integrity issues that occur inside the circuit are normally ignored. Accordingly, the timing parameters generated by the simulation may be too optimistic or incorrect.

Furthermore, the circuit or subcircuit block is viewed as a black box when the circuit simulation is performed. However, the simulations results observed at the pins cannot detect the above-mentioned reliability issues that can occur inside the circuit. The models based upon simulation and characterization results could be incorrect thereby causing yield and reliability problems.

SUMMARY OF THE INVENTION

In accordance with the present invention there is provided a method for performing a signal integrity and delay check in a circuit simulation wherein the circuit has a plurality of nodes. The method includes selecting the nodes of the circuit to be checked. A current minimum and a current maximum optimization parameter are determined for the circuit simulation. A current optimization parameter is calculated by averaging the current minimum optimization parameter and the current maximum optimization parameter. In the preferred embodiment, the optimization parameter may be the setup or hold time used in the circuit simulation.

Next, a primary criteria parameter is determined based on the optimization parameters. The primary criteria parameter is checked to see if it converges into a prescribed range. If the primary criteria parameter converges, then the measurement results from the circuit simulation are parsed in order to generate bisection convergence data. In the preferred embodiment, the primary criteria parameter is a bisection error of the circuit simulation.

If the primary criteria parameter does not converge, then the circuit is simulated using the current (i.e., averaged) optimization parameter. For the signal integrity check, switch difference errors are calculated for the circuit simulation using the current optimization parameter. For the delay check, delay difference errors are calculated for the circuit simulation using the current optimization parameters. The status of the circuit simulation is determined in response to the respective switch difference errors and delay difference errors. In response to the status, the optimization parameter is set to a new optimization parameter and the simulation proceeds to determine if convergence of the primary criteria parameter occurs.

BRIEF DESCRIPTION OF THE DRAWINGS

These, as well as other features of the present invention, will become more apparent upon reference to the drawings wherein.

DETAILED DESCRIPTION

Various aspects will now be described in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both. Thus, the various aspects can be embodied in many different forms, and all such forms are contemplated to be within the scope of what is described. The instructions of a computer program as illustrated in FIGS. 1(1A and 1B), 2(2A and 2B) and 6(6A and 6B) can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used herein, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non exhaustive list) of computer readable-medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDROM or DVDROM).

The present invention generally relates to Applicants' co-pending patent applications: "TIMING SOFT ERROR CHECK", U.S. patent application Ser. No. 10/729,596, "RELIABILITY BASED CHARACTERIZATION USING BISECTION", U.S. patent application Ser. No. 10/729,697 now U.S. Pat. No. 7,131,088, "VERIFICATION AND CHARACTERIZATION OF NOISE MARGIN IN INTEGRATED CIRCUIT DESIGNS", U.S. patent application Ser. No. 10/729,701, and "GLITCH AND METASTABILITY CHECKS USING SIGNAL CHARACTERISTICS", U.S. patent application Ser. No. 10/729,785, the entire contents of each application being incorporated herein by reference.

Figure 1A:
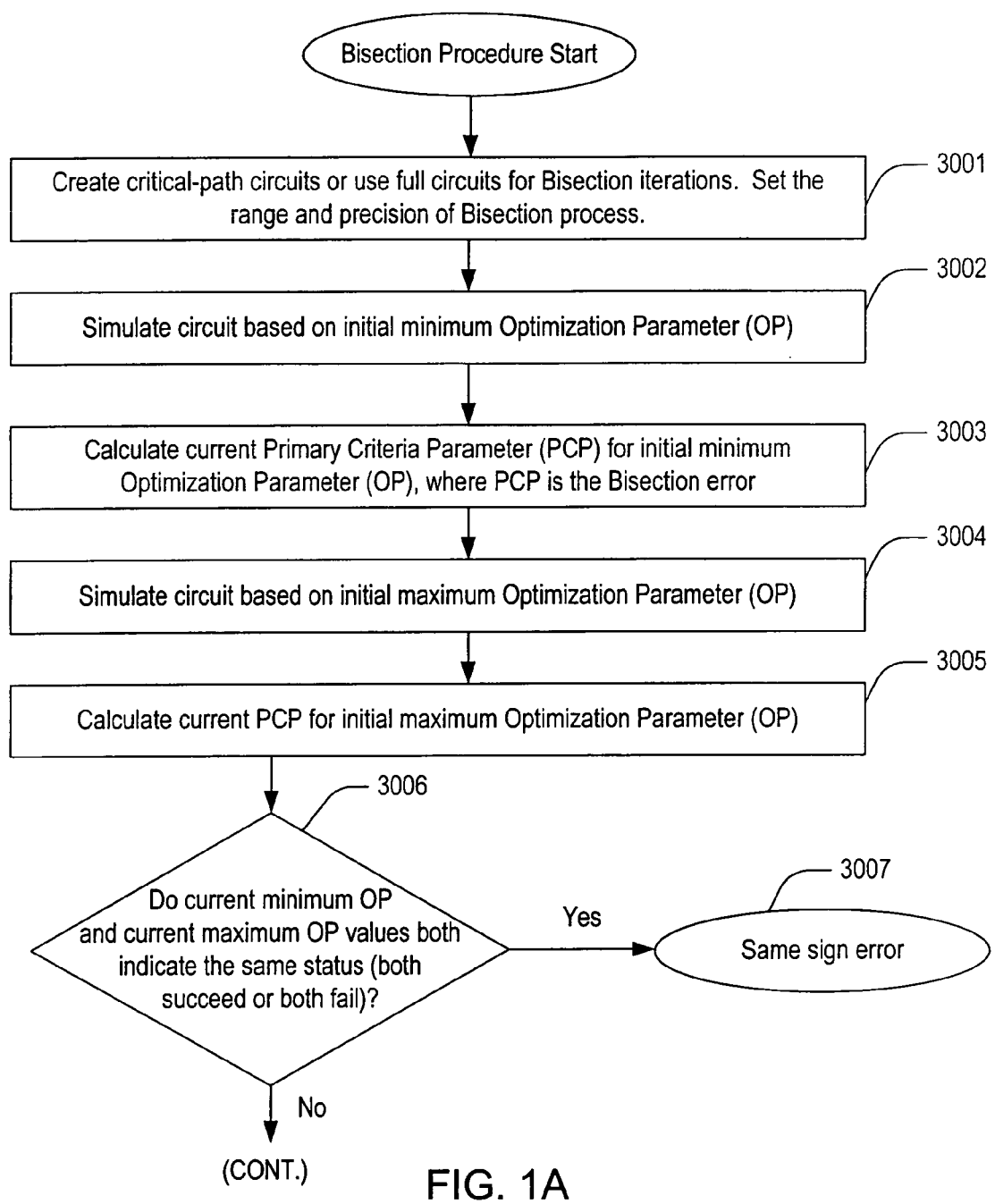
FIGS. 1(1A and 1B) is a flowchart illustrating a method of reliability based characterization of an integrated circuit having a delay check and an integrity check.
Figure 1:
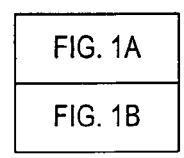
Figure 1B:
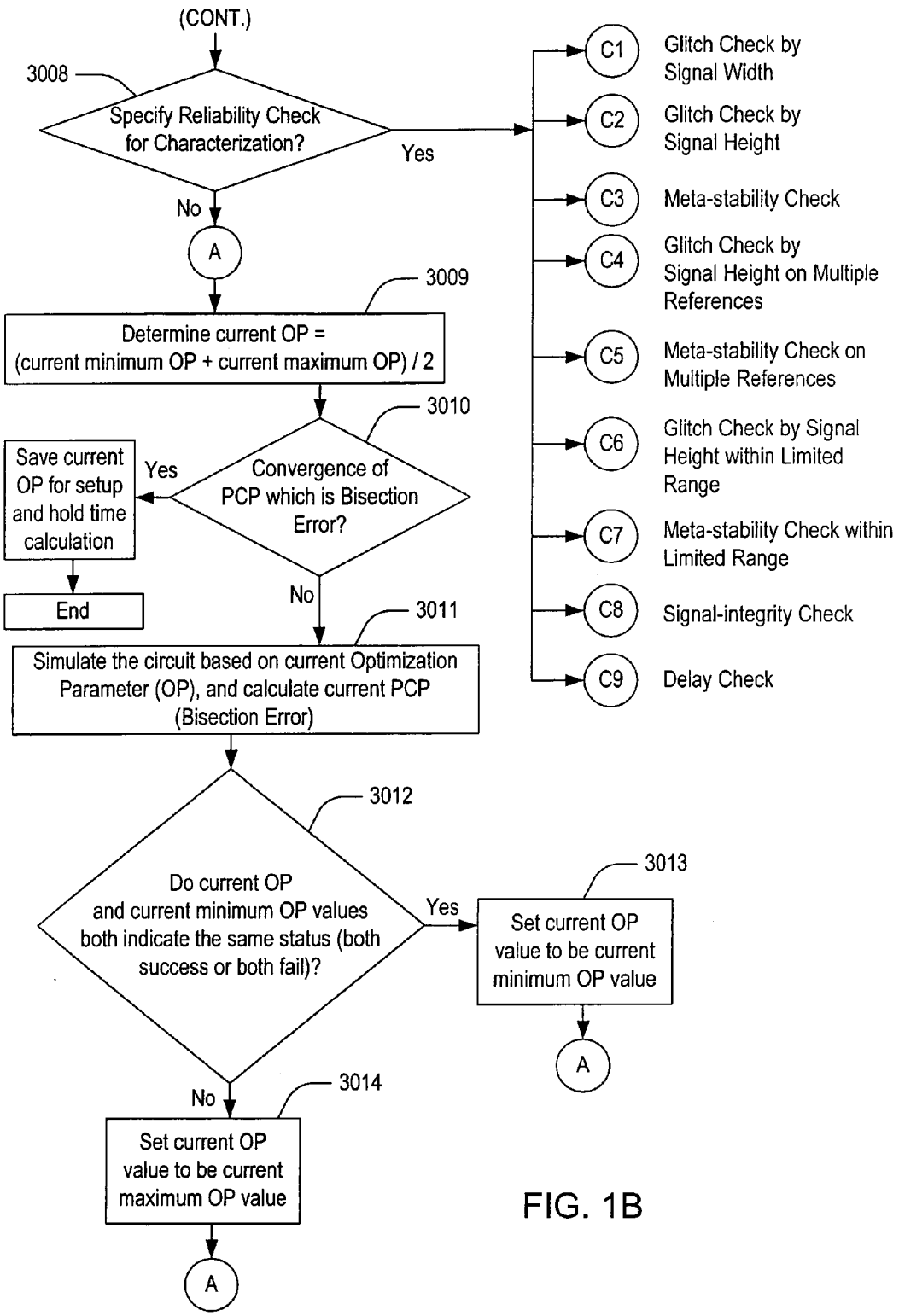

Referring now to the drawings wherein the showings are for purposes of illustrating preferred embodiments of the present invention only, and not for purposes of limiting the same, FIGS. 1(1A and 1B) is a flowchart illustrating a method of determining an optimized parameter for a circuit simulation. In step 3001, critical-path circuits or full circuits for the circuit simulations are selected for the bisection procedure. The range and precision of the bisection procedure, as well as the clock cycle for the simulation needs to be selected by the user. In step 3002, the critical path circuits or full circuits selected in step 3001 are simulated based on an initial optimization parameter (OP). For the reliability based characterization illustrated in FIGS. 1(1A and 1B), the OP is the setup time or hold time for the circuit and the initial and maximum OP's are determined by user specified information. In step 3003, a current primary criteria parameter (PCP) for the initial minimum OP is calculated. The PCP is the bisection error for the setup time or hold time previously selected. Once the PCP is calculated, then the circuit chosen in step 3001 is simulated for the initial maximum optimization parameter (OP) in step 3004. In step 3005, the current PCP is then calculated for the initial maximum OP.

In step 3006, the values of the current minimum OP and the current maximum OP are compared to determine if they both indicate the same status (i.e., both succeed or both fail). If both the current minimum OP and the current maximum OP indicate the same status for the simulation, then the process proceeds to step 3007 where the process ends because of a same sign error. However, if the current minimum OP and the current maximum OP do not indicate the same status, then the process proceeds to step 3008 where other reliability checks on the circuit may be performed. As will be further explained below, the user can choose to perform either a signal integrity check at step C8 or a delay check at C9 or both.

If the user decides not to perform any other reliability checks in step 3008, then the process proceeds to step 3009 where the current OP is calculated. The current OP is calculated by averaging the current minimum OP and the current maximum OP. After the current OP has been calculated, the PCP is checked for convergence in step 3010. The convergence is determined by whether the bisection error (i.e., PCP) has converged into a bisection precision range which is specified by the user. If the bisection error has converged, then the current OP is saved as the setup or hold time for any subsequent calculations. However, if there is no convergence of the bisection error, then the circuit simulation is executed again in step 3011 using the current OP calculated in step 3009.

After the circuit simulation has been performed in step 3011, the process proceeds to step 3012 where the current OP and the current minimum OP are compared. If both values of the OP indicate the same status, (i.e., both success or both fail), then the process proceeds to step 3013 wherein the current OP value is set to be the current minimum OP value and the process continues at point "A" at step 3009 where the current OP is calculated until the convergence of PCP (i.e., bisection error) occurs.

However, if in step 3012, the current OP and the current minimum OP values do not indicate the same status, then the process proceeds to step 3014 where the current OP is set to be the maximum OP value. Then the process returns to point "A" and step 3009 where the process continues until the bisection error converges. In this respect, the process iteratively repeats to find the optimized setup and hold time.

As previously mentioned above, one of the reliability checks that can be selected in step 3008 is a signal integrity check "C8". The signal integrity violation is becoming increasingly serious in SoC designs and memory designs which contain dynamic logics, latches, flip-flops and feedback circuits, etc. The signal integrity check is executed during verification and characterization. A signal integrity violation can happen on any node in the circuit relevant to the dynamic logic, latches, flip-flops and feedback circuits.

Figure 7:
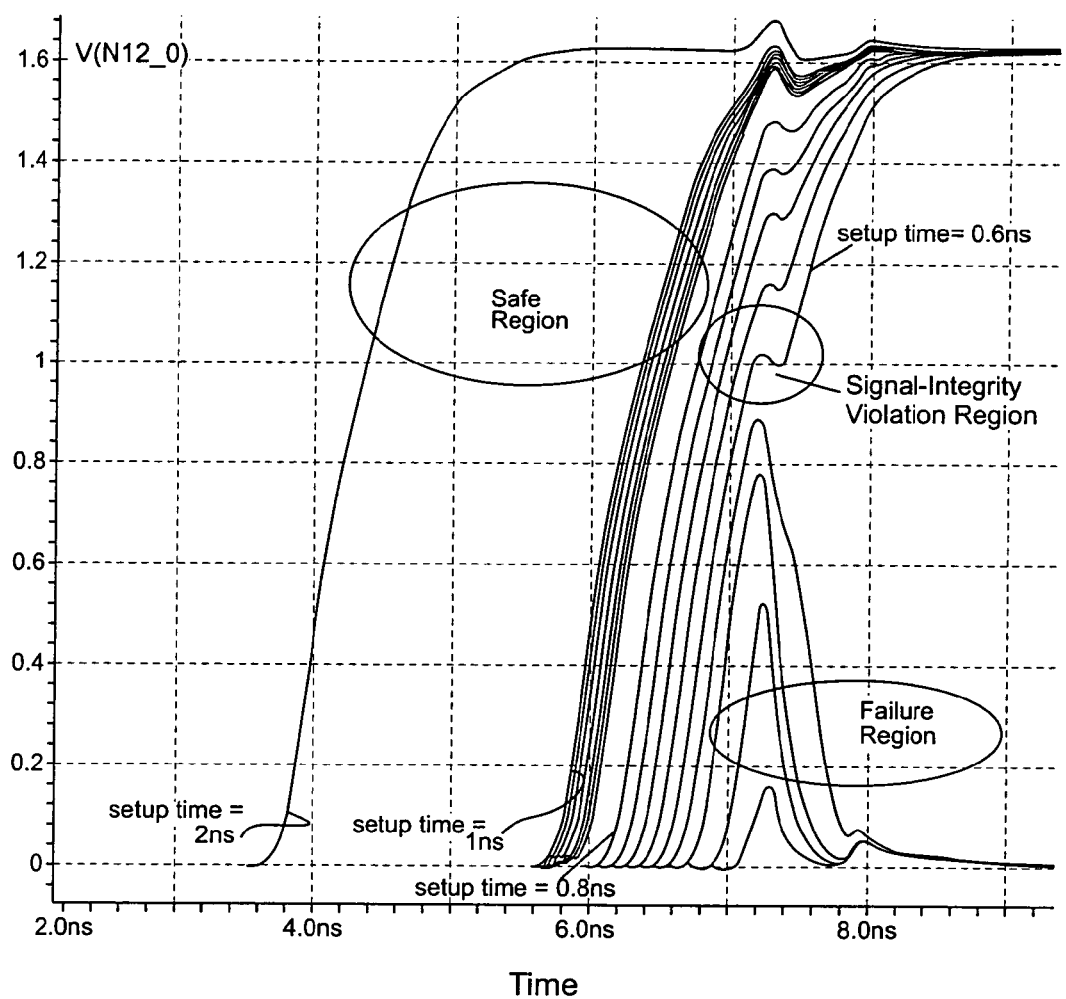
FIGS. 7, 8 and 9 are graphs showing signal integrity violations.

Referring to FIG. 7, a diagram illustrating a signal integrity violation at a latch output node N12_0 for decreasing setup times is shown. As can be seen in FIG. 7, as the setup time at Data-In pin (I_4) decreases from 1 nanosecond to 0.8 nanoseconds the possibility of integrity violation of the signal at node N12_0 increases. The signal integrity violation is obvious as the setup time falls critically small. Without a signal integrity check, bisection could converge at a setup time value of 0.6 nanoseconds. However, with the signal integrity check, the setup time of Data-In pin (I_4) could be pushed into the safe region above 1 nanosecond.

Figure 8:
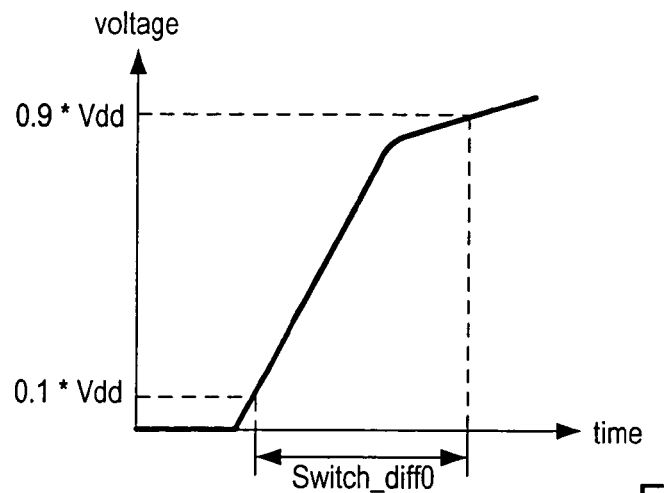
Figure 9:
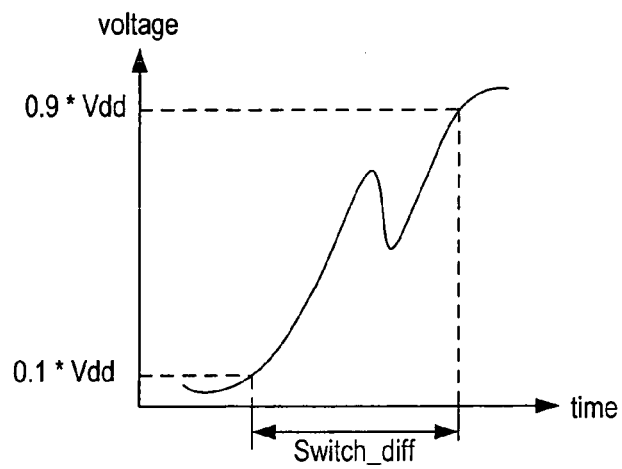

The signal integrity violation is measured by the 'switch-DiffErr' (i.e., switch difference error) term in automation software tools and is calculated as follows:

switch DiffErr=abs((switch_diff−switch_diff_ref)/ switch_diff_ref)

where referring to FIGS. 8 and 9:
switch_diff_ref is the 0.1 Vdd to 0.9 Vdd transition time measured when the setup time of a selected input pin (data_in, chip_select or write_enable, etc) vs. clock is infinite on the reference node; and
switch_diff is the 0.1 Vdd to 0.9 Vdd transition time on the selected reference node during bisection procedure.

The switchDiffErr represents the severity of the signal integrity on the reference node and is used to determine whether a successful bisection result is to aggressive or not.

Signal integrity check can be performed on any reference node. The reference node can be automatically located by matching circuit patterns (e.g., latch subcircuit) with automation tools or be located specifically by the user.

Figure 10:
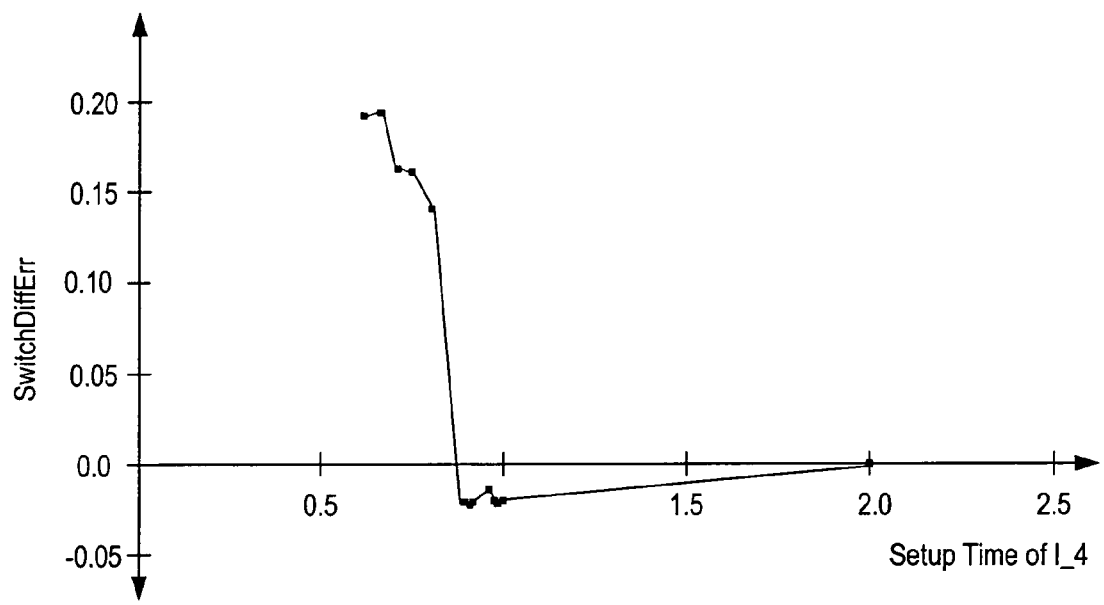
FIG. 10 is a graph showing the severity of a signal integrity violation versus setup time.

Referring to FIG. 10, the severity of the signal integrity violation versus the setup time for the Data-In pin (I_4) is illustrated. If the Data-In pin (I_4) setup time is too small, then the signal integrity problem becomes serious. As illustrated in FIG. 10, when the setup time falls below a threshold, then the signal integrity violation as measured by switchDiffErr increases dramatically.

Figure 6A:
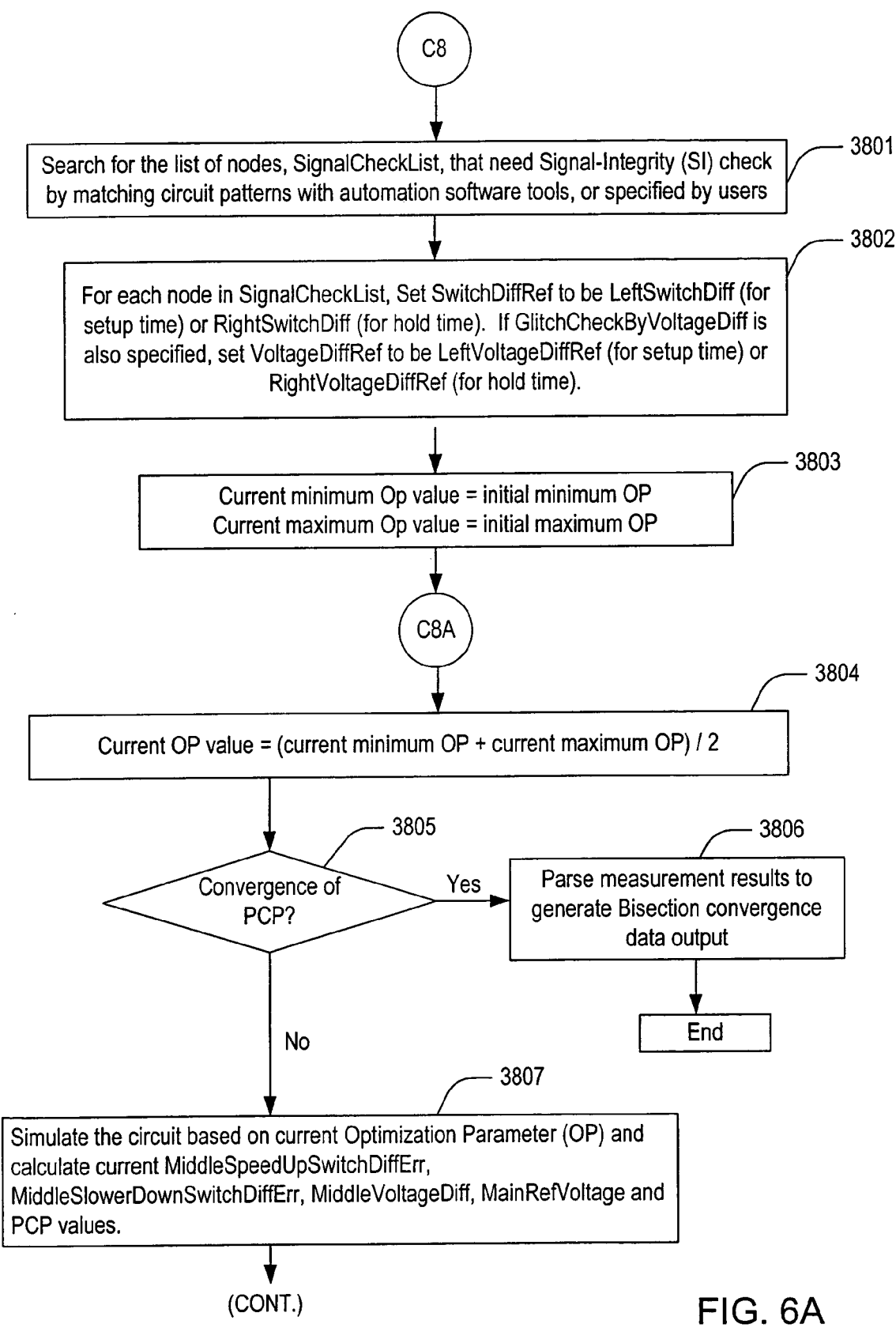
FIGS. 6(6A and 6B) is a flowchart illustrating the signal integrity check in characterization.
Figures 6, 6A, 6B:
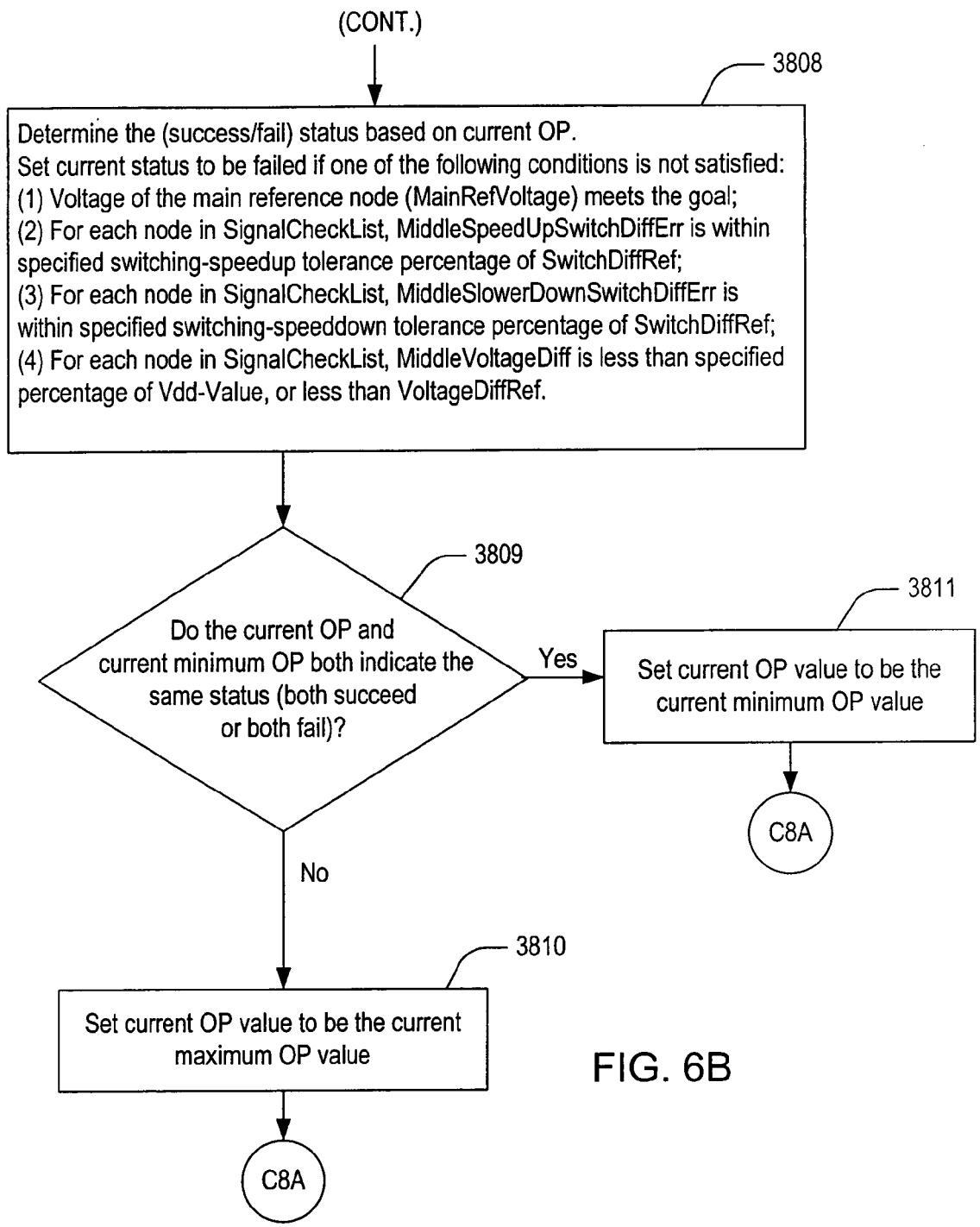

Referring to FIGS. 6(6A and 6B), a flowchart illustrating the method of checking the signal integrity is shown. The signal integrity is checked from step 3008 of FIGS. 1(1A and 1B). In step 3801 of FIGS. 6(6A and 6B), a list of nodes that need to be checked for signal integrity is searched. All nodes in the SignalCheckList can be automatically located by matching circuit patterns with automatic software tools or can be specified by users. The process of searching for the nodes to populate the SignalCheckList only needs to be done once and be recorded either in memory or in files for repeated use in bisection procedures.

For each node identified in step 3801, the switchDiffRef is set to be the LeftSwitchDiff (Left Switch Difference for setup time) or RightSwitchDiff(Right Switch Difference for hold time) in step 3802. For the setup time, the SwitchDiffRef is set to the LeftSwitchDiff because the left side setup time is considered infinite. Similarly, for hold time, the SwitchDiffRef is set to the RightSwitchDiff because the right side hold time is considered infinite. Furthermore, in step 3802, the glitch check by voltage difference (GlitchCheckbyVoltageDiff) may be turned on because critical nodes may not switch at critical edges. Instead, the nodes tend to glitch when the setup/hold time is too aggressive because of the signal integrity problem.

In step 3803, the current minimum OP value is set to the initial minimum OP value. Furthermore, the current maximum OP value is set to the initial maximum OP value. As previously mentioned, the OP may be the setup or hold time for the circuit.

Next, in step 3804, the current OP value is set to be the average of the current minimum OP value and the current maximum OP value. After the current OP value has been calculated, then the PCP is checked for convergence. As previously stated, the PCP is the bisection error and convergence is determined by whether the bisection error (i.e., PCP) has converged into a bisection precision range specified by the user. If the bisection error has converged in step 3805, then the measurement results are parsed to generate bisection convergence data output in step 3806 and the process ends.

However, if the PCP does not converge in step 3805, then the circuit is simulated based on the current OP and the prescribed values are calculated. Specifically, for each node, the MiddleSpeedUpSwitchDiffErr (Middle Speedup Switch Difference Error) is calculated to measure switching speedup behavior on each critical node. Furthermore, MiddleSlowDownSwitchDiffErr (Middle Slowdown Switch Difference Error) is calculated to measure switching slowdown behavior on each critical node. Additionally, MiddleVoltageDiff (Middle Voltage Difference) is calculated to measure glitch height on each critical node. The PCP values and MainRefVoltage (Main Reference Voltage) values are also calculated in step 3807.

In step 3808, the status (success/fail) of the circuit simulation for the current OP is determined. Specifically, the status of a simulation is set to fail if any one of the following conditions is not satisfied:
1) For the current OP, the voltage of the main reference node (MainRefVoltage) meets the specified value or goal thereby checking main reference node operation;
2) For each node in the SignalCheckList, the MiddleSpeedUpSwitchDiffErr is within a specified switching speedup tolerance percentage of SwitchDiffRef (Switch Difference Reference) thereby detecting abnormal switching speed up due to a signal integrity problem;
3) For each node in the SignalCheckList, MiddleSlowDownSwitchDiffErr is within a specified switching slowdown tolerance percentage of SwitchDiffRef thereby detecting an abnormal switching slow down; and
4) For each node in SignalCheckList, MiddleVoltageDiff is less than a prescribed percentage of Vdd_Value, or less than VoltageDiffRef (Voltage Difference Reference) thereby detecting glitches.

If any one of the above-mentioned conditions is not satisfied then the status of the current OP is set to fail.

In step 3809, the status of both the current OP and the current minimum OP are compared. If they are both the same status (i.e., both succeed or both fail), then the process continues to step 3811 where the current OP value is set to be the current minimum OP value and the process returns to point "C8A" where the process continues until the bisection error (i.e., PCP) converges. However, if the status is not the same for both the current OP and the current minimum OP then the process proceeds to step 3810 where the current OP value is set to the current maximum OP value and the process returns to point "C8A" where the process continues until the bisection error converges.

Figure 3:
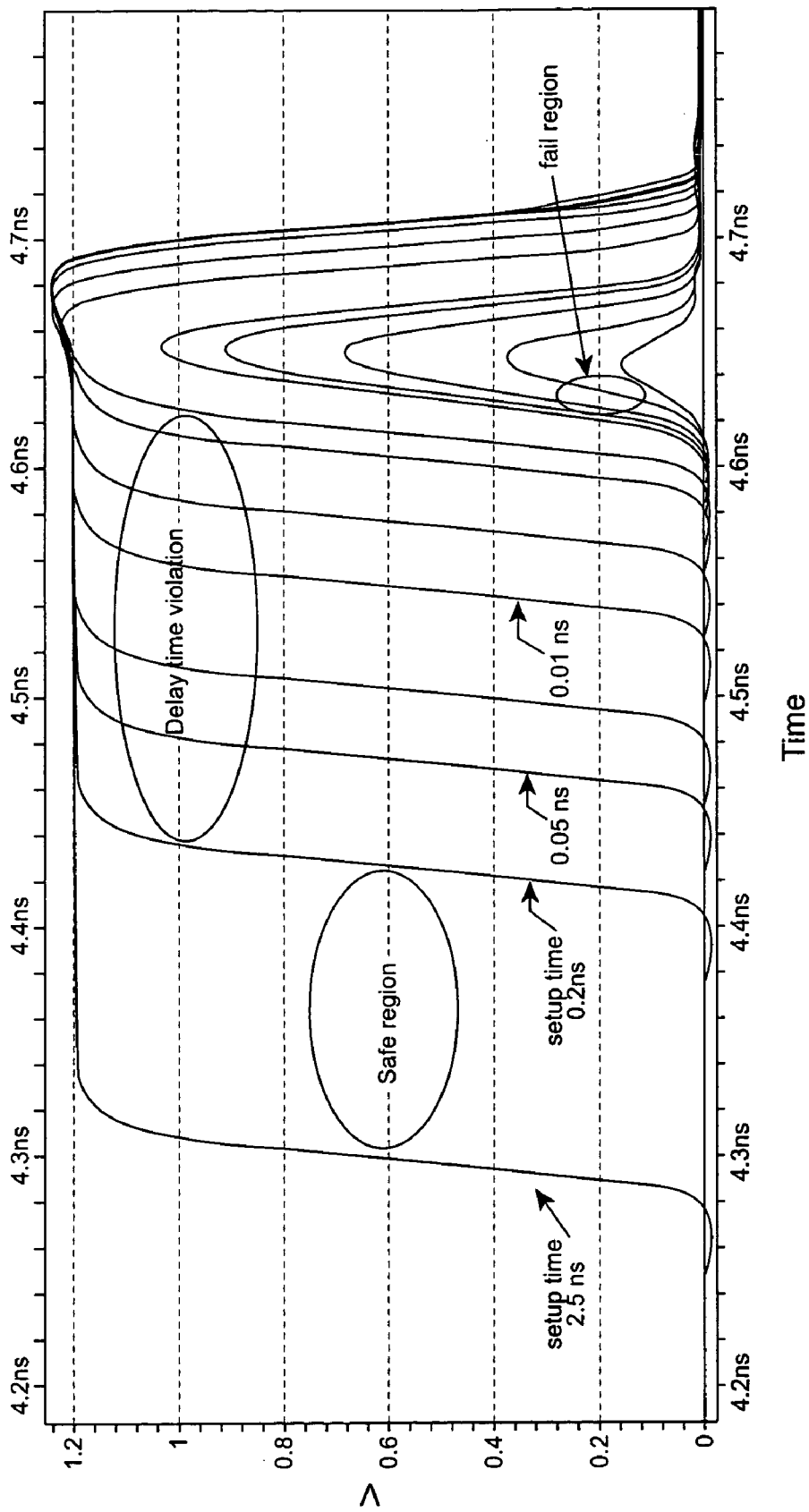
FIG. 3 is a graph showing delay time violation.

In addition to the foregoing, it is also possible to determine delay time violations. The delay time violation is becoming increasingly serious in SoC designs and memory designs which contain dynamic logic, latches, flip-flops and feedback circuits. The delay time violations can occur on any nodes in the relevant circuit. Referring to FIG. 3, a delay time violation appearing on wordline (WL_30) for the setup time of an Address pin (A[6]) is shown. As can be seen in FIG. 3, as the setup time for address pin (A[6]) is reduced, the delay time violation becomes greater. Without a delay check, the bisection error could converge at a setup time value of 0.025 nanoseconds where the signal fails. However, with a delay time violation check, the setup time of address pin (A[6]) can be pushed back into the safe region above 0.10 nanoseconds.

Figure 4:
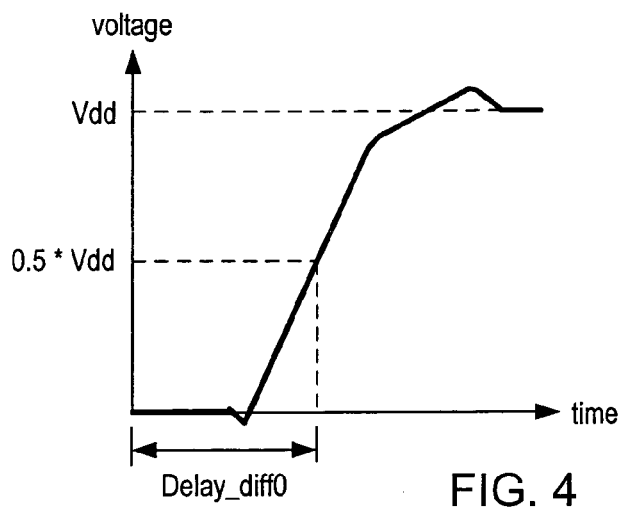
FIG. 4 is a graph showing the delay measurement of a signal.

The delay violation is measured by the delayDiffErr (Delay Difference Error) term in automation software tools and is characterized by:

$$delayDiffErr = abs((delay\_diff - delay\_diff\_ref)/delay\_diff\_ref) \quad (5)$$

where referring to FIG. 4:
delay_diff_ref (Delay Difference Reference) is from 0.0 ns (or 0.5*Vdd clock node transition time) to 0.5*Vdd reference node transition time when the setup time or hold time of a chosen input pin (data_in, chip_select, write_enable or address, etc.) versus clock is infinite on the reference node; and
delay_diff (Delay Difference) is from 0.0 ns (or 0.5*Vdd clock node transition time) to 0.5*Vdd reference node transition time on the reference node during the bisection procedure.

The delayDiffErr represents the severity of the delay on the reference node and can be used to determine whether a successful bisection result is to aggressive or not. The delay violation check can be performed on any reference node.

Figure 5:
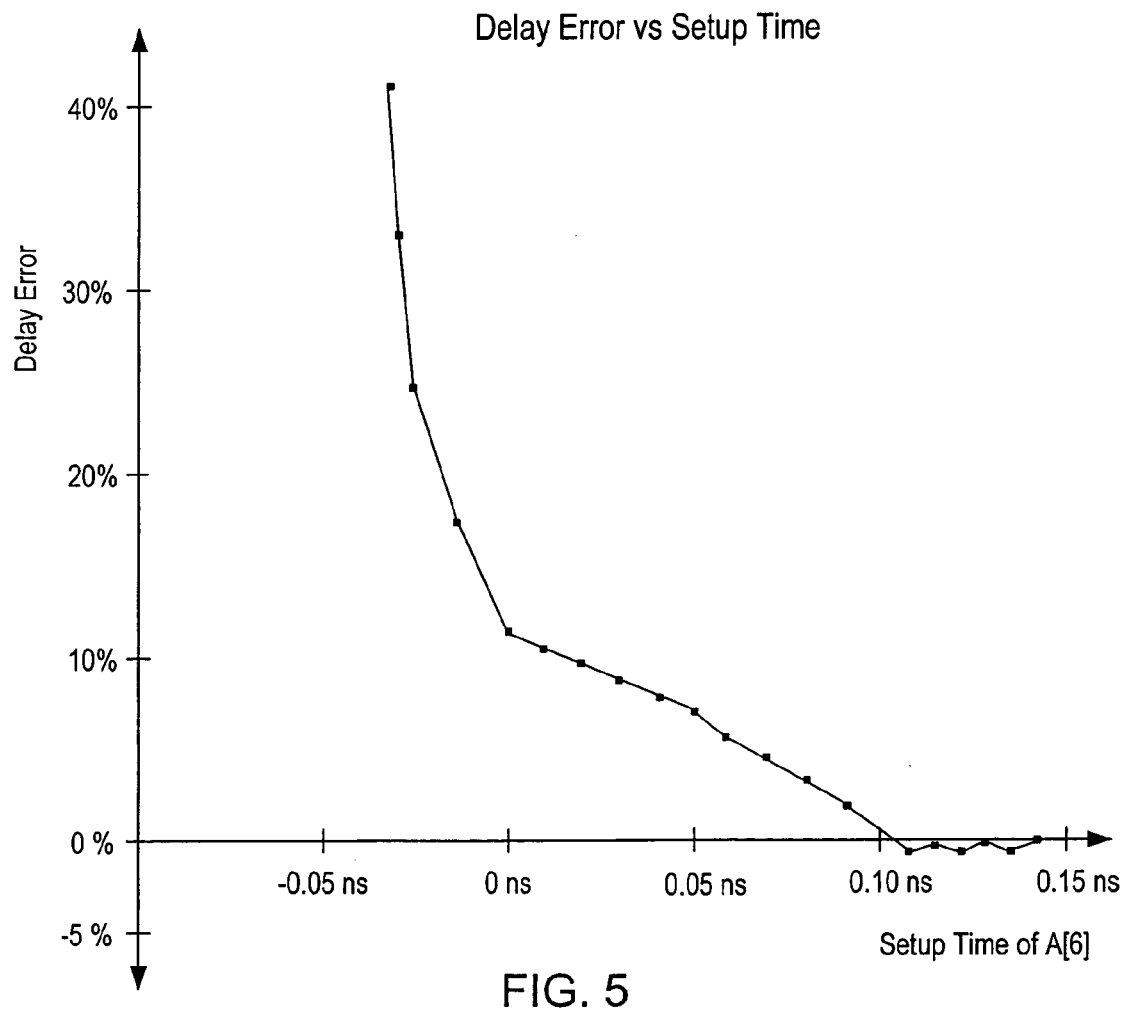
FIG. 5 is a graph showing delay error versus setup time.

Referring to FIG. 5, the severity of a delay violation versus the setup time of Address pin (A[6]) is shown. If the setup time for the Address is too small, then the delay error increases. Specifically, if the setup time of the Address pin (A[6]) falls below a threshold (for example 0.0 ns for FIG. 5), then the severity of the delay violation increases dramatically.

Figures 2, 2A:
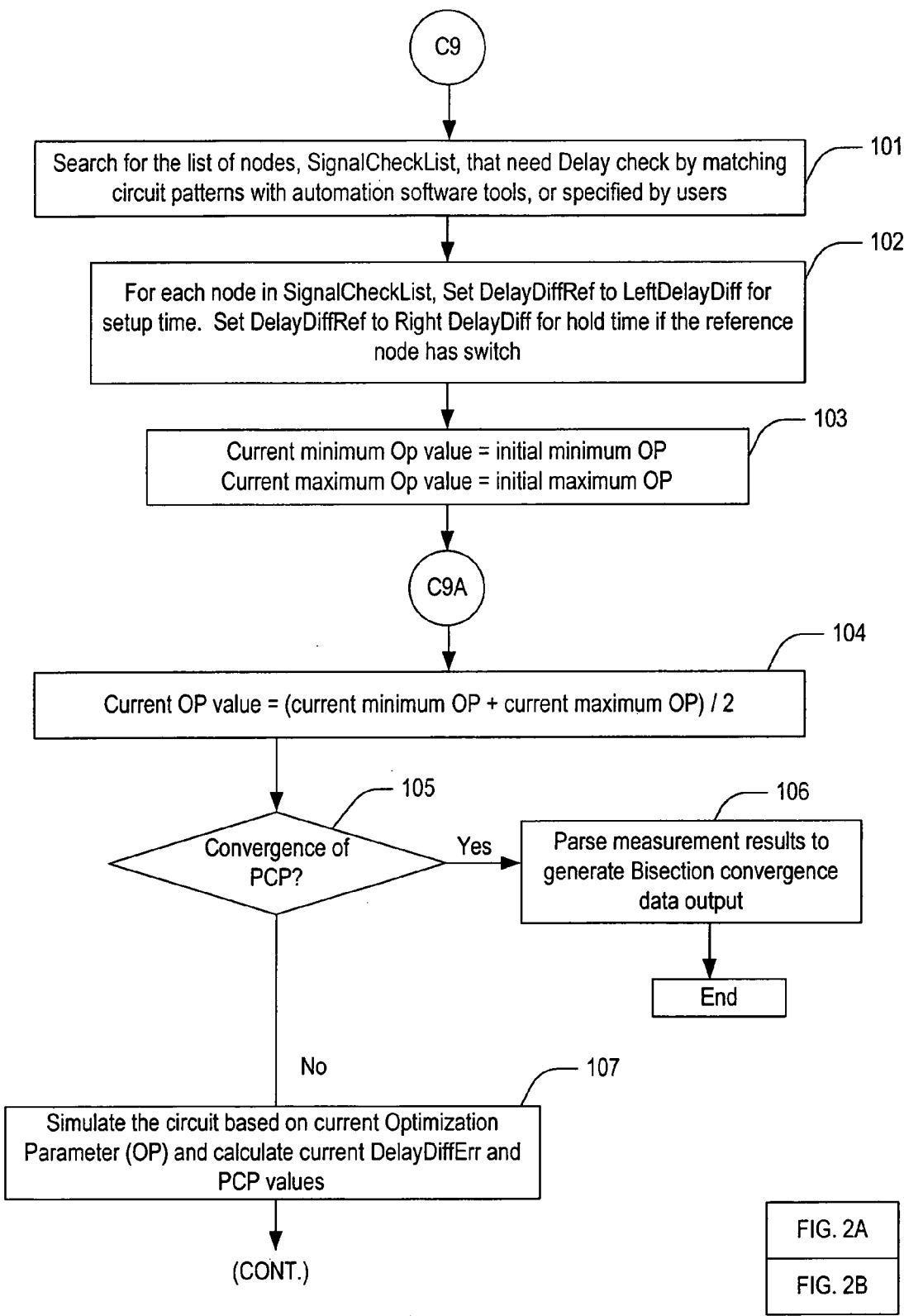
FIGS. 2(2A and 2B) is a flowchart illustrating the delay check in characterization.
Figure 2B:
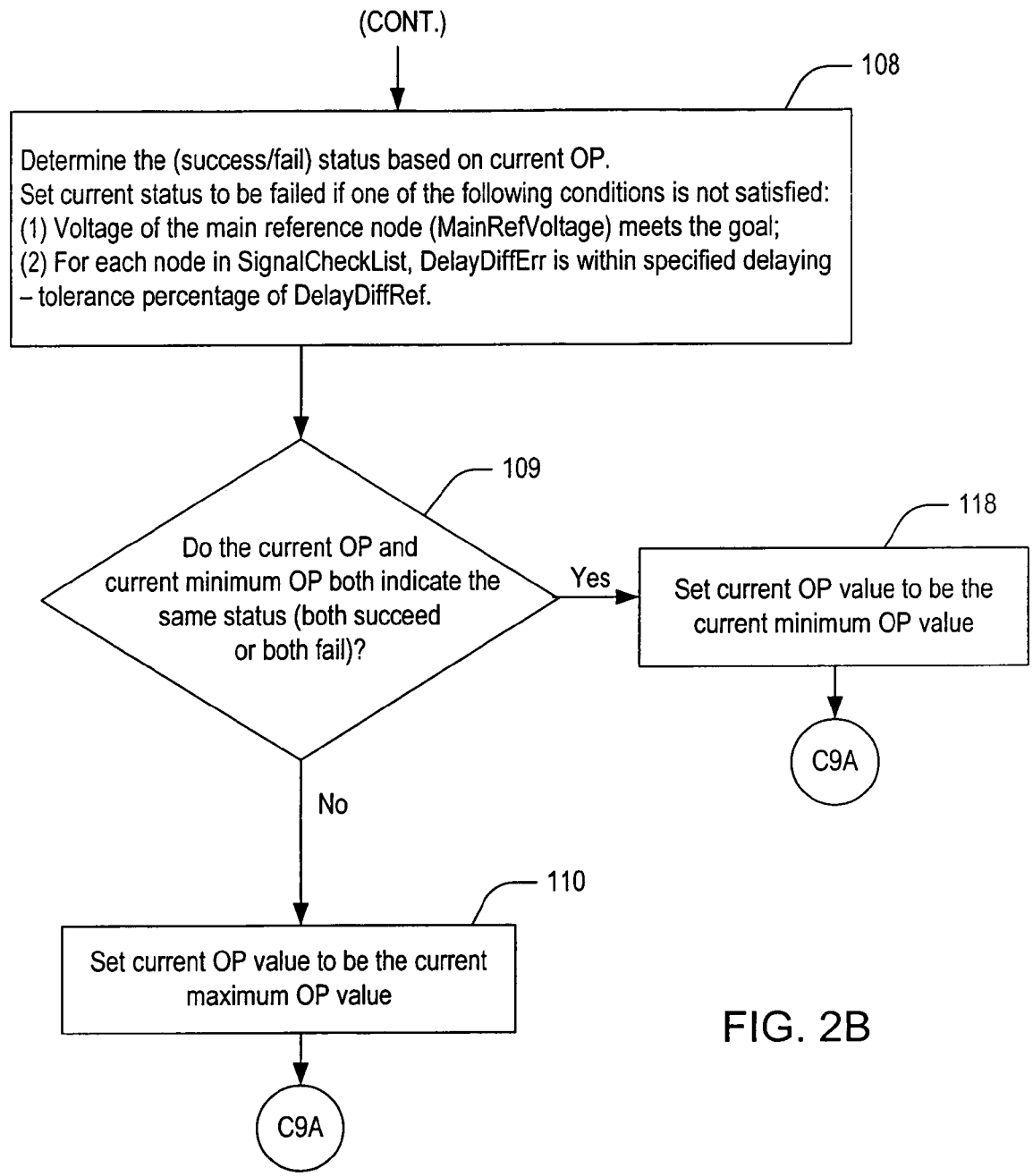

Referring to FIGS. 2(2A and 2B), the method of calculating the delay violation is shown. The delay check begins from step 3008 of FIGS. 1(1A and 1B). In step 101 of FIGS. 6(6A and 6B), a list of nodes that need to be checked for delay check is searched. All nodes in the SignalCheckList can be automatically located by matching circuit patterns with automatic software tools or can be specified by users. The process of searching for all nodes in the SignalCheckList only needs to be done once and be recorded either in memory or in files for repeated use in bisection procedures.

In step 102, for each node in the SignalCheckList, the DelayDiffRef is set to the LeftDelayDiff (Left Delay Difference) for a setup time measurement because the left-side setup time is considered infinite. Similarly, the DelayDiffRef for each node is set to the RightDelayDiff (Right Delay Difference) because the right side hold time is considered infinite.

Next, in step 103, the current minimum OP value is set to the initial minimum OP value and the current maximum OP value is set to the initial maximum OP value. In step 104, the current OP value is set to be the average of the current minimum OP value and the current maximum OP value. As previously mentioned, the OP may be the setup or hold time for the circuit.

After the current OP value has been calculated, the PCP is checked for convergence. As previously stated, the PCP is the bisection error and convergence is determined by whether the bisection error (i.e.,PCP) has converged into a bisection precision range specified by the user. If the bisection error has converged in step 105, then the measurement results are parsed to generate bisection convergence data output in step 106 and the process ends. However, if the PCP does not converge in step 105, then the circuit is simulated using the OP in step 107 and DelayDiffErr and PCP values are calculated as well. The DelayDiffErr is a measure of the delay variation on each critical node.

After the simulation has been performed and the DelayDiffErr and PCP values have been calculated in step 107, the status of the simulation is determined in step 108 based on the current OP. The status of a simulation is set to fail if one of the following conditions is not met:
1) Voltage on the main reference node (MainRefVoltage) is not satisfied thereby checking main reference node operation; and
2) For each node in the SignalCheckList, the DelayDiffErr is within a prescribed delaying tolerance percentage of DelayDiffRef thereby detecting abnormal delaying variation problems.

If any one of the above-mentioned conditions is not satisfied then the status of the current OP is set to fail.

In step 109, the status of both the current OP and the current minimum OP are compared. If they are both the same status (i.e., both succeed or both fail), then the process continues to step 118 where the current OP value is set to be the current minimum OP value and the process returns to point "C9A" where the process continues until the bisection error (i.e., PCP) converges. However, if the status is not the same for both current OP and the current minimum OP then the process proceeds to step 110 where the current OP value is set to the current maximum OP value and the process returns to point "C9A" where the process continues until the bisection error converges.

It will be appreciated by those of ordinary skill in the art that the concepts and techniques described herein can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalents thereof are intended to be embraced.

What is claimed is:
1. A method for performing a signal integrity check of a circuit in a circuit simulation wherein the circuit has a plurality of nodes, the method comprising the following steps:
selecting the nodes of a circuit to be checked;
determining a current minimum optimization parameter and a current maximum optimization parameter for the circuit simulation;
calculating a current optimization parameter from an average of the current minimum optimization parameter and the current maximum optimization parameter;
calculating a primary criteria parameter based on the minimum and maximum optimization parameters;
determining whether the calculated primary criteria parameter converges to a prescribed range;
if the primary criteria parameter converges to a prescribed range, then parsing measurement results from the circuit simulation to generate bisection convergence data; and
if the primary criteria parameter does not converge then:
simulating the circuit using the current optimization parameter;
calculating switch difference errors for the circuit simulation using the current averaged optimization parameter;
determining a status of the circuit simulation in response to the switch difference errors; and
setting the current optimization parameter to a new optimization parameter in response to the status of the circuit simulation.
2. The method of claim 1 wherein the primary criteria parameter is a bisection error of the circuit simulation.

3. The method of claim 1 wherein the method reiterates until the primary criteria parameter converges into the prescribed range.

4. The method of claim 1 wherein the optimization parameter is a setup time for the circuit simulation.

5. The method of claim 1 wherein the optimization parameter is a hold time for the circuit simulation.

6. The method of claim 1 wherein if the primary criteria parameter doe not converge then determining the status of the circuit simulation comprises determining the following conditions:
   determining if a main reference voltage is a prescribed value;
   determining for each node whether a middle speedup switch difference error is within a specified tolerance of a switch difference reference;
   determining for each node whether a middle slowdown switch difference error is within a specified tolerance of the switch difference reference; and
   determining for each node whether a middle voltage difference is less than a prescribed voltage reference.

7. The method of claim 6 wherein the status is set to fail if any of the conditions are not satisfied.

8. The method of claim 7 wherein the step of setting the current optimization parameter to a new optimization parameter comprises setting the current optimization parameter to the current minimum optimization parameter if both the current optimization parameter and the current minimum optimization parameter indicate the same status.

9. The method of claim 8 further comprising a step of reiterating the method until the primary criteria parameter converges.

10. The method of claim 7 wherein the step of setting the current optimization parameter to a new optimization parameter comprises setting the current optimization parameter to the current maximum optimization parameter if the circuit simulations using the current optimization parameter and the current minimum optimization parameter do not indicate the same status.

11. The method of claim 10 wherein the method reiterates until the primary criteria parameter converges.

12. A method of performing a delay check of a circuit in circuit simulation wherein the circuit has a plurality of nodes, the method comprising the following steps:
   selecting the nodes of the circuit to be checked;
   determining a current minimum optimization parameter and a current maximum optimization parameter for the circuit simulation;
   calculating a current optimization parameter from an average of the current minimum optimization parameter and the current maximum optimization parameter;
   calculating a primary criteria parameter based on the minimum and maximum optimization parameters;
   determining whether the calculated primary criteria parameter converges to a prescribed range;
   if the primary criteria parameter converges to a prescribed range, then parsing measurement results from the circuit simulation to generate bisection convergence data; and
   if the primary criteria parameter does not converge, then:
      simulating the circuit using the current optimization parameter;
      calculating delay difference errors for the circuit simulation using the current optimization parameter;
      determining a status of the circuit simulation in response to the delay difference errors; and
      setting the current optimization parameter to a new optimization parameter in response to the status of the circuit simulation.

13. The method of claim 12 wherein the primary criteria parameter is a bisection error of the circuit simulation.

14. The method of claim 12 wherein the method reiterates until the primary criteria parameter converges into the prescribed range.

15. The method of claim 12 wherein the optimization parameter is a setup time for the circuit simulation.

16. The method of claim 12 wherein the optimization parameter is a hold time for the circuit simulation.

17. The method of claim 12 wherein if the primary criteria parameter does not converge then determining the status of the circuit simulation comprises determining conditions wherein a main reference voltage is a prescribed value and, for each node, the delay difference error is within a prescribed tolerance of a delay difference reference.

18. The method of claim 17 wherein the status is set to fail if any of the conditions are not satisfied.

19. The method of claim 18 wherein the step of setting the current optimization parameter to a new optimization parameter comprises setting the current optimization parameter to the current minimum optimization parameter if the circuit simulations using the current optimization parameter and the current minimum optimization parameter indicate the same status.

20. The method of claim 19 further comprising a step of reiterating the method until the primary criteria parameter converges.

21. The method of claim 18 wherein the step of setting the current optimization parameter to a new optimization parameter comprises setting the current optimization parameter to the current maximum optimization parameter if the circuit simulations using the current optimization parameter and the current minimum optimization parameter do not indicate the same status.

22. The method of claim 21 further comprising a step of reiterating the method until the primary criteria parameter converges.

* * * * *